United States Patent [19]
Kurihara et al.

[11] Patent Number: 5,820,685
[45] Date of Patent: Oct. 13, 1998

[54] WAFER SUPPORT DEVICE

[75] Inventors: Kunio Kurihara, Tokyo; Masayuki Hashimoto, Chiba-ken, both of Japan

[73] Assignee: Applied Materials, Inc., Santa Clara, Calif.

[21] Appl. No.: 810,625

[22] Filed: Feb. 28, 1997

[51] Int. Cl.⁶ .................................................. C23C 16/00
[52] U.S. Cl. .......................... 118/729; 118/715; 118/728; 156/345
[58] Field of Search .................................. 118/715, 728, 118/729; 156/345

[56] References Cited

U.S. PATENT DOCUMENTS 5,589,224  12/1996  Tepman ..................................... 118/728

*Primary Examiner*—Richard Bueker

[57] ABSTRACT

A wafer support device which supports a wafer horizontally from below in the process chamber of the semiconductor production device. A plate-shaped susceptor is placed below the wafer so that the plate surface is parallel to the wafer and has at least three through holes passing through it vertically. Lift pins which can each move axially pass through each of the through holes in the susceptor. Protrusions which support the wafer from its lower surface and which form a space between the wafer and the susceptor are installed on the upper ends of the lift pins. In this way reaction gas can flow between the wafer (2) and the susceptor (21) and form a thin film on the bottom surface of the wafer (2) as well as on the top surface.

4 Claims, 3 Drawing Sheets

WAFER SUPPORT DEVICE

BACKGROUND OF THE INVENTION

1. FIELD OF THE INVENTION

The present invention concerns a wafer support element used in semiconductor production devices such as Chemical Vapor Deposition (CVD) devices.

2. DISCUSSION OF RELATED ART

Generally, when thin films are formed and etching performed on wafers in a CVD device, the wafer is supported horizontally from below. FIG. 1 shows a conventional wafer support device; on a disc shaped susceptor (1) arranged horizontally in the process chamber, the through holes (3) passing through the susceptor (1) are formed in three locations at 120° intervals on a circle having a diameter less than that of the wafer (2). The taper sections (3a) with gradually increasing diameters and which face the upper surface (1a) of the susceptor (1) are formed on the upper part of the through holes (3). The lift pins (4) each pass through each of those through holes (3). Thus, each lift pin (4) is made so as to be able to move axially (upwards and downwards). Also, the taper sections (4a) with gradually increasing diameters and which face the upper end are formed on the head of each lift pin (4) to fit on the taper sections (3a) of the through holes (3) so that the lift pins (4) can be stopped at the susceptor (1) and hang down.

In a CVD device equipped with such a wafer support device, the formation of the thin films is executed as follows: the wafer is placed on the upper surface (1a) of the susceptor (1) as shown in FIG. 1, the prescribed reaction gas is supplied to the process chamber, the gas is excited by heat, light, or plasma, and cracking, dissociation, or a reaction between different compounds is caused.

In the above conventional wafer support device, the lift pins (4) are used to raise the wafer (2) from the susceptor by an arm (not pictured) which moves freely up and down contacting the lower free ends when the wafer (2) is transported. In other words, when the thin film is formed, the configuration is such that the upper ends of the lit pins (4) become even with the upper surface (1a) of the susceptor (1) with the lift pins (4) hanging downward and the wafer (2) placed on the susceptor (1) with no intervening space; therefore although a thin film can be formed on the surface (upper surface) of the wafer (2), a thin film can not be formed on the back surface (bottom surface).

Thus, what is desired is a wafer support device which can allow for processing, such as thin film formation, on both sides of the wafer.

SUMMARY OF THE INVENTION

The present invention is a wafer support device which supports a wafer horizontally from its lower surface inside the process chamber of a semiconductor production device and comprises a plate shaped susceptor placed below the wafer with the plate surface parallel to the wafer, lift pins which can move axially while passing through each of the through holes in the susceptor, and protrusions formed on the upper ends of the lift pins to support the wafer from below while forming a space between the wafer and susceptor.

With a wafer support device of this type of structure, the gas supplied to the process chamber passes through the space between the wafer and susceptor since the wafer is supported with space between the wafer and susceptor. Consequently, a thin film can be formed and etching can be performed on the bottom surface of the wafer as well as the upper wafer surface.

Also, since the protrusions which form the space between the wafer and the susceptor are formed on the lift pins, susceptors used in earlier devices can be used without further processing and the device can be supplied at low cost.

An embodiment of the present invention is characterized by the lift pins, in the wafer support device, being able to be stopped at the susceptor and the protrusions protruding beyond the upper surface of the susceptor with the lift pins in the state of being stopped at the susceptor.

In another embodiment of the present invention the wafer support device has at least three control elements to control the edge of the wafer supported on the protrusions installed on the upper surface of the susceptor. The wafer is very thin and light and since it is just resting on the protrusions, there is a risk of it slipping during the process. Consequently, the wafer will not slip if the control elements to control the edge of the wafer are installed on the susceptor. The control elements do not necessarily have to contact the edge of the wafer since the wafer falling from the protrusions due to slippage can be prevented as much as possible.

In another embodiment of the present invention, the wafer support device supports a wafer horizontally from its lower surface in the process chamber of a semiconductor production device; it is characterized by being equipped with a plate shaped susceptor placed below the wafer with the plate surface parallel to the wafer and being pierced vertically by at least three through holes and lift pins which can move axially while passing through each of the through holes on the susceptor and by the lift pins being positioned around the edge of the wafer and having lift sections protruding radially to the inside of the wafer to form a gap between the wafer and the susceptor and to support the wafer from the bottom surface and a control section to control the edge of the wafer. In this wafer support device, the lift pins have the functions of supporting the wafer and of controlling the edge; since it is not necessary to have lift pins and separate control elements, special processing need not be performed on the susceptor.

DETAILED DESCRIPTION OF THE PRESENT INVENTION

The present invention is a novel wafer support device. In the following description numerous specific details are set forth in order to provide a thorough understanding of the present invention. It will be obvious however, to those skilled in the art that the present invention may be practiced without these specific details. In other instances well known equipment and processes have not been specified in detail in order to not unnecessarily obscure the present invention.

Figure 2:
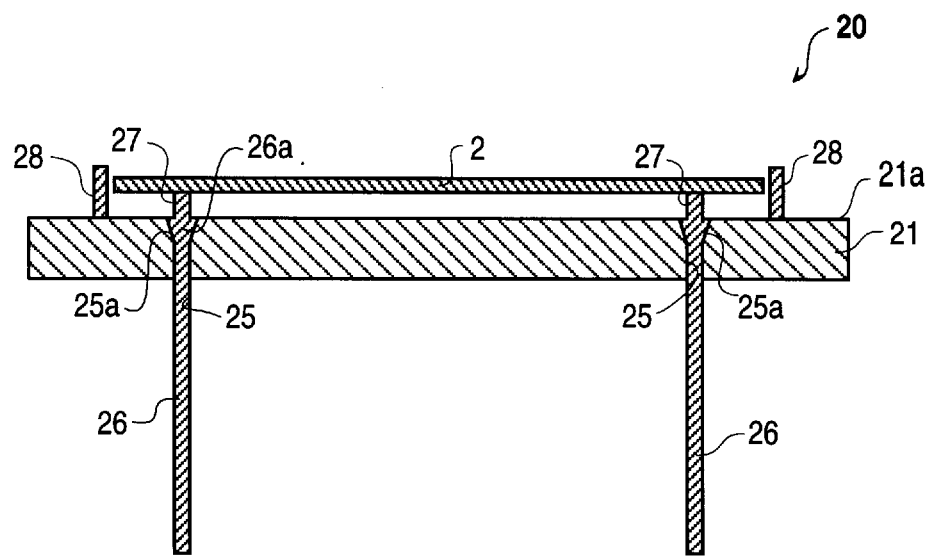
FIG. 2 is a frontal cross section view illustrating an embodiment of the wafer support device of the present invention.
Figure 3:
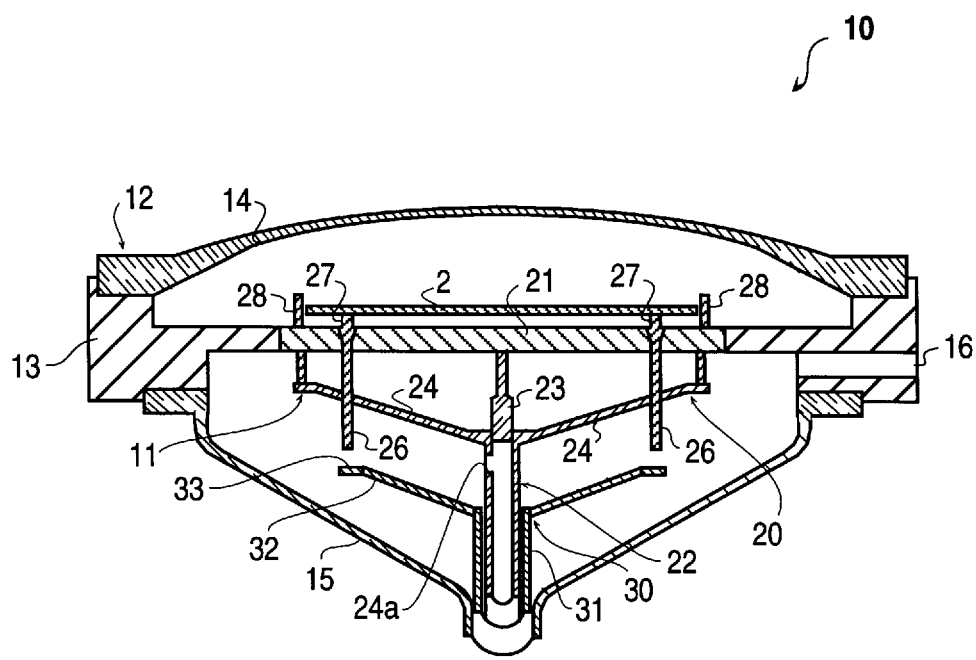
FIG. 3 is a frontal cross section view illustrating a CVD device in which a wafer support device of the present invention is installed.
Figure 4:
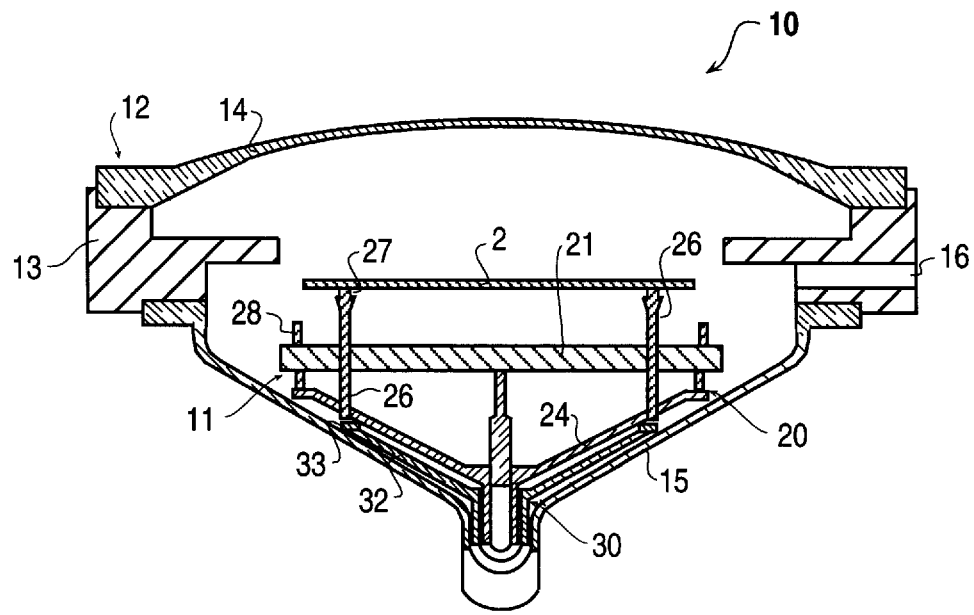
FIG. 4 is a frontal cross section view illustrating a CVD device in which a wafer support device of the present invention is installed.

FIG. 2–4 show a working form of the present invention; the CVD device (10) shown in FIG. 3 roughly comprises a process chamber (12) to hold a wafer (2) and a wafer support device (11) and a driving device which is not pictured here. The process chamber (12) consists of a base ring (13) consisting of metal in the form of a thick ring, a quartz window (14) closing off the upper section of that base ring (13), and a quartz chamber floor (15) installed so that the lower section of the base ring (13) is closed off and which is connected to the driving device. A path (16) for wafer (2) transport through to the outside of the process chamber (12) is formed on the base ring (13).

In the process chamber (12), the disc shaped susceptor (21) of the wafer support device (20) is supported from below by the supports (22) each connected to the driving device (not pictured) for vertical movement and rotary movement. The supports (22) are equipped with the central axis (23) fixed in the center of the bottom surface of the susceptor (21) and the arms (24) fixed at 120° intervals in three places (only two locations shown in figure) on the edge of the lower surface of the susceptor (21); each arm (24) is installed on the top end of the hollow shaft (24a). Thus, the susceptor (21) can be moved up and down and rotated.

On the susceptor (21) which is placed horizontally in the process chamber (12), through holes (25) passing through the susceptor (21) are formed in 120° intervals in three locations (only two are shown in FIG. 2 and FIG. 3) on a disk having a smaller diameter than the wafer (2) as shown in FIG. 2. The taper section (25a) with a gradually increasing diameter and facing the upper surface (21a) of the susceptor (21) is formed on the upper sections of the through holes (25). The lift pins (26) pass through each of these through holes (25). Thus each lift pin (26) can move axially (up and down). Also, the taper sections (26a) with gradually increasing diameters and which face the upper end are formed on the head of each lift pin (26) to fit on the taper sections (25a) of the through holes (25) so that the lift pins (26) can stop at the susceptor (21) and hang down. Also, the lift pins (26) pass through the arms (24) of the support (22) and the lower ends (free ends) extend to positions below the arms (24). Moreover, the lift pins (26) move upwards and downwards with respect to the arms (24) as well.

Figure 1:
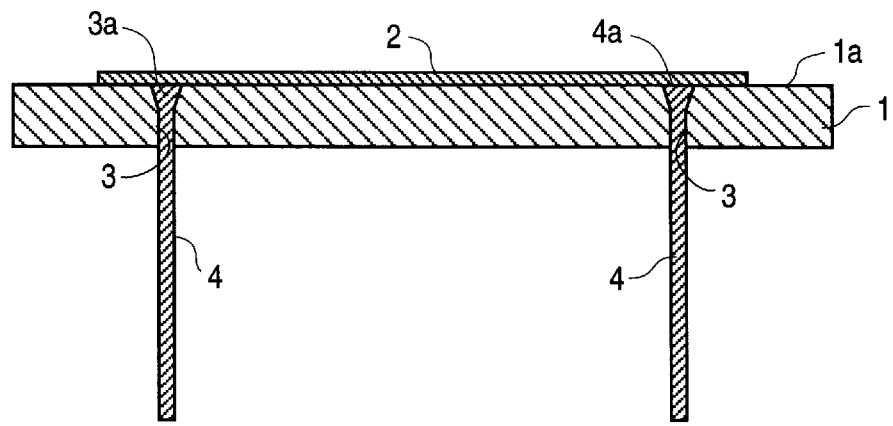
FIG. 1 is a frontal cross section view illustrating a conventional wafer support device.

Furthermore, the upper end surface of each lift pin (26) is formed to become even with the upper surface (21a) of the susceptor (21) as shown in FIG. 1 with the lift pins (26) hanging down and stopped at the susceptor (21). Also, the protrusions (27) are formed on the upper end of each lift pin (26) so that the wafer (2) can be supported with space between the wafer (2) and the susceptor (21). These protrusions (27) are small, cylindrical protrusions with diameters less than the diameters of the upper ends of the lift pins (26) and are formed as part of the lift pins (26).

Also, on the upper surface (21a) of the susceptor (21), control pins (28) which stick up beyond the height of the set wafer (2) are placed in three locations (only two locations are shown in FIG. 2) in 120° intervals on the same circle so that the edge of the wafer (2) can be controlled in the state of the wafer (2) being placed on each protrusion (27).

Meanwhile, a press element (30) which can rotate and move up and down to press up the lift pins (26) is installed on the outside of the support (22) supporting the susceptor (21). This press up element (30) consists of the hollow shafts (31) in which the hollow shaft (24a) of the arms (24) of the support (22) fit and the three arms (32) installed on the upper ends of those hollow shafts (31) which extend up to a position corresponding to the bottom end of each lift pin (26). Also, the pads (33) which can strike the bottom ends of the lift pins (26) are each affixed to the end of each arm (32). The press up element (30) is rotated synchronously with the support element (22) so that it can correspond to the rotation of the lift pins (26) which is according to the susceptor (21).

In the CVD device with this configuration, the wafer (2) which is transported by means of the path (16) of the process chamber (12) is received on the lit pins (26) and protrusions (27) in the execution of thin film formation on the wafer (2) for example as shown in FIG. 4. At this time, the susceptor (21) drops to a prescribed position due to the downward movement of the support (22). At the same time, the press up element (30) also moves downward, but since the support (22) is displaced greatly, the lower ends of the lift pins (26) press against the pads (33) of the press up element (30) and the upper ends of the lift pins (26) press out beyond the upper surface (21a) of the susceptor (21). In this state, the wafer (2) is received by the protrusions (27) on the lift pins (26).

Then, as shown in FIG. 3, the support (22) and the press up element (30) are moved up to a prescribed position until the lift pins (26) hang down to and are stopped at the susceptor (21). At this time, the lower ends of the lift pins (26) are separated from the pads (33) on the press up element (30) and become free since the support (22) is displaced greatly. Also, the upper end surfaces of the lift pins (26) become even with the upper surface (21a) of the susceptor (21), but the protrusions (27) protrude from the upper surface (21a) of the susceptor (21).

Thus, as shown in FIG. 2, the wafer (2) is supported horizontally at a distance from the susceptor (21) by the protrusions (27) on the lift pins (26). Consequently, when the reaction gas is supplied to the process chamber (12), that gas passes over the wafer (2) and between the lower surface of the wafer (2) and the upper surface (21a) of the susceptor (21). As a result, the thin film is formed on the lower surface as well as the upper surface of the wafer (2).

Also, the wafer (2) will not drop or slip from the protrusions (27) during processing since the edge of the wafer (2) is controlled by the control pins (28).

Moreover, the wafer (2) on which the thin films have been formed is moved to reach the state as shown in FIG. 4 again and is transported from the process chamber (12).

Figure 5:
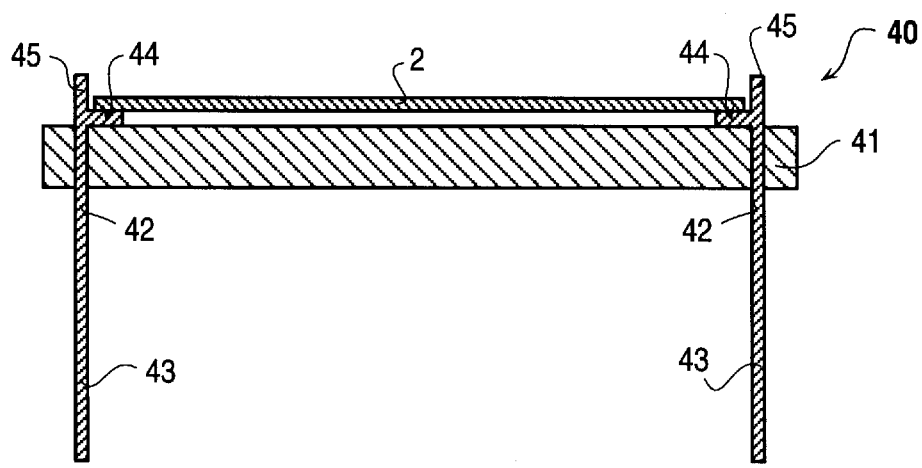
FIG. 5 is a frontal cross section showing an alternative embodiment of the wafer support device of the present invention.

FIG. 5 shows another working form of the present invention; the through holes (42) are formed on the disc shaped susceptor (41) in this wafer support device (40) in three locations (only two locations are shown here) at intervals of 120° around a circle having a slightly greater diameter than the edge of the wafer (2) which is supported horizontally. The lift pins (43) pass through holes (42). Each lift pin (43) is made to move axially (up and down). Also, a nubbin-shaped lift section (44) to protrude radially to the inside of the supported wafer (2) and a pin shaped control element (45) to control the edge of the wafer (2) are formed on the upper section of each lift pin (43). The lift section (44) supports the wafer (2) and forms a gap between the wafer (2) and the upper surface (41a) of the susceptor (41) has the function of stopping the lift pins (43) at the susceptor (41).

This type of wafer support device (40) is used in combination with the CVD device (10) shown in FIGS. 3 and 4 in the same way as the wafer support device (20) in the above working form. Also, the usage and results of the wafer support device (40) in this working form are the same as those of the wafer support device (20) in the above working form.

With this working form in particular, the lift pins (43) have the function of controlling the edge of the wafer (2) and supporting the wafer (2); it is not necessary to install an edge support element for wafer (2) separately from the lift pins (43).

Moreover, in the above first working form, the protrusions (27) are formed as part of the lift pins (26), but this invention is not limited to such a working form; if it takes a form where the protrusions (27) are mounted separately on the lift pins (26), the height of the space formed between the wafer (2) and the susceptor (21) can be adjusted appropriately.

Also, the protrusions (27) may be formed in the shape of hemispheres or triangular based pyramids, not only cylinders. If they are formed in such a manner, the protrusions become point contacts with the wafer (2) and make it easy to perform the thin film formation on the bottom surface.

Also, the structure may be such that the upper sections of the through holes (25) in the susceptor (21) have a tapered form as the lift pins (26) hang down and a collar is installed on the upper sections of the lift pins (26); thus the lift pins (26) are stopped at the susceptor (21) by the collar.

As above, with the wafer support device for semiconductor production devices of this invention, it is possible to perform processing such as thin film formation on both sides of the wafer since protrusions to support the wafer and form a space between the bottom surface of the wafer and the upper surface of the susceptor are formed by the upper ends of the lift pins.

Also, the wafer will not slip or fall from the protrusions if control elements to control the edge of the wafer are installed on the susceptor.

Furthermore, it is not necessary to install control elements separate from the lift pins if the lift pins have both the functions of supporting the wafer and controlling the edge.

We claim:

1. A wafer support device to support a wafer from its lower surface horizontally within a process chamber of a semiconductor production device, said wafer support device comprising:

a plate-shaped susceptor arranged beneath the wafer so that the plate surface is parallel to the wafer and being pierced vertically by at least three through holes;

a plurality of lift pins which can move axially while passing through each of the through holes of the susceptor; and protrusions to support the wafer from below which form a gap between the wafer and the susceptor and are formed on the upper ends of the lift pins.

2. The wafer support device of claim 1 wherein the lift pins being able to be stopped at the susceptor and wherein the protrusions protrude above the upper surface of the susceptor when the lift pins are stopped at the susceptor.

3. The wafer support device of claim 1, further comprising at least three control elements to control the edge of the wafer supported by the protrusions.

4. A wafer support device to support a wafer from its lower surface horizontally within a process chamber of a semiconductor production device; said wafer support device comprising:

a plate shaped susceptor arranged beneath the wafer so that the plate surface is parallel to the wafer and being pierced vertically by at least three through holes; and lift pins which can move axially while passing through each of the through holes of the susceptor, the lift pins being positioned around the edge of the wafer and having lift sections protruding radially to the inside of the wafer to form a gap between the wafer and the susceptor and to support the wafer from the bottom surface and a control section to control the edge of the wafer.

* * * * *